United States Patent [19]
Lee et al.

[11] Patent Number: 5,859,802
[45] Date of Patent: Jan. 12, 1999

[54] INTEGRATED CIRCUIT MEMORY DEVICES HAVING MAIN AND SECTION ROW DECODERS FOR PROVIDING IMPROVED BURST MODE OPERATION

[75] Inventors: Jin-Ho Lee; Hee-Chul Pack, both of Seoul, Rep. of Korea

[73] Assignee: Samsung Electronics Co., Ltd., Suwon, Rep. of Korea

[21] Appl. No.: 986,742

[22] Filed: Dec. 8, 1997

[30]   Foreign Application Priority Data

Dec. 6, 1996 [KR]   Rep. of Korea ...................... 96-62415

[51] Int. Cl.$^6$ .................................................. G11C 7/00
[52] U.S. Cl. .................. 365/200; 365/230.06; 365/238.5
[58] Field of Search ............................. 365/200, 230.06, 365/238.5, 233

[56]   References Cited

U.S. PATENT DOCUMENTS

| | | | |
|---|---|---|---|
| 5,299,164 | 3/1994 | Takeuchi et al. | 365/200 |
| 5,428,573 | 6/1995 | Watanabe | 365/200 |
| 5,502,676 | 3/1996 | Pelley, III et al. | 365/200 |
| 5,621,690 | 4/1997 | Jungroth et al. | 365/200 |
| 5,737,269 | 4/1998 | Fujita | 365/200 |

*Primary Examiner*—Son T. Dinh
*Attorney, Agent, or Firm*—Myers Bigel Sibley & Sajovec

[57]   ABSTRACT

Integrated circuit memory devices having improved burst mode operation include an array of memory cells arranged as a plurality of normal rows of memory cells electrically coupled to respective normal section word lines (SWL) and a plurality of redundant rows of memory cells electrically coupled to respective redundant section word lines (RSWL). A first normal section row decoder is also provided. The first normal section row decoder has first inputs electrically coupled to a plurality of burst address selection lines (Ci, Cj, Ck and Cl), a second input electrically coupled to a normal main word line (MWL) and outputs electrically coupled to a plurality of the normal section word lines (SWL1–4). A first redundancy section row decoder is also preferably provided. The first redundancy section row decoder has first inputs electrically coupled to the plurality of burst address selection lines, a second input electrically coupled to a redundant main word line (RMWL) and outputs electrically coupled to a plurality of the redundant section word lines (RSWL1–4). Normal main row decoder circuitry is also provided and is responsive to a most significant portion of a row address. When the appropriate portion of a predetermined row address is provided, the main row decoder circuitry drives the corresponding normal main word line. Moreover, redundant main row decoder circuitry is provided and is responsive to the most significant portion of the row address. When the appropriate portion of a predetermined row address is provided, the redundant main row decoder circuitry drives the corresponding redundant main word line.

6 Claims, 6 Drawing Sheets

INTEGRATED CIRCUIT MEMORY DEVICES HAVING MAIN AND SECTION ROW DECODERS FOR PROVIDING IMPROVED BURST MODE OPERATION

FIELD OF THE INVENTION

The present invention relates to integrated circuit memory devices and methods of operating same, and more particularly to memory devices having burst mode capability and methods of operating same.

BACKGROUND OF THE INVENTION

Semiconductor memory devices, such as static random access memory (RAM) devices, commonly use burst mode operation to raise the efficiency of data access. During burst mode operation, internal addresses are sequentially generated upon receipt of an external address. During data reading or writing operations, rows of memory cells are then selected by the internal addresses. Thus, when selecting different rows of memory cells, a controller, such as a microprocessor, does not need to supply all the addresses in sequence. Instead, the controller may supply specific addresses for burst mode operation only once as the external addresses. To provide burst mode operation, a counter internal to the memory device sequentially generates a plurality of internal addresses based on a received external address. For example, static RAMs may receive 2 specific addresses and then generate 4 internal addresses using the counter.

Typically, the external addresses applied to a volatile semiconductor memory device having a typical redundancy scheme are provided to an address buffer and then to a normal decoder for normal operation and to a redundancy decoder for redundancy operation. The addresses generated by the address buffer are commonly controlled by an internal clock synchronized with an external clock.

FIG. 1 shows a conventional semiconductor memory device. If external addresses are applied to an address buffer 10, the external addresses may be separated into an address signal for normal operation and an address signal for redundancy operation by an address control clock which is the internal clock. The separated signals are respectively supplied to a normal decoder 14 and a redundancy decoder 12. The normal decoder 14 enables one selected word line among a plurality of normal word lines 16 within a memory cell array 18. The redundancy decoder 12 further receives a burst address and enables one selected word line among a plurality of redundancy word lines 20 within the memory cell array 18.

FIG. 2 is a detailed circuit diagram of the redundancy decoder 12 shown in FIG. 1. The redundancy decoder 12 includes master fuses MF, a plurality of internal fuses F, driving transistors N1–N3, N5, P1 and P2, decoding transistors N6 and N7, an output inverter INV and a decoding output NAND gate NAN1. To replace a normal word line connected to a defective cell with a redundancy word line, the redundancy decoder 12 receives external addresses A1–A5 and burst addresses C1 and C2 from a redundancy repair circuit therein (not shown). A redundancy word line enable signal RWL is generated at an output terminal of the NAND gate NAN1 (depending on whether the internal fuses F are cut to match the applied address {A1–A5, C1–C2}). This redundancy word line enable signal RWL enables a respective redundancy word line. Based on the decoding circuits of FIGS. 1–2, the address control clock K2 cannot be used in an internal circuit of the redundancy decoder 12, but is applied directly to the address buffer 10 situated at the front of the redundancy decoder 12. This is because there are two kinds of addresses applied to the redundancy decoder of FIG. 2. One address is the external address A1–A5 which is a normal address, and the other address is the burst address C1 and C2. However, when applying these separate addresses to the decoder 12 of FIG. 2, a normal address control clock may not be used together with a burst address control clock because the normal address control clock and the burst address control clock have opposite transitions. To address this limitation, the burst address control circuit of FIG. 3 is installed at the front of the redundancy decoder 12.

Referring to FIG. 3, there is shown a burst address control circuit for receiving address control clocks K1 and K2 and input burst signals RN1, RN2, RC1 and RC2 and generating a controlled burst address C1, C2. The burst address control circuit includes pass gates NA1–NA4 (containing inverters IN1–IN4) and inverters I10, I11, I20 and I21. If the semiconductor memory device is set in a normal mode of operation, an address controlled by the address control clock K2 is generated. Here, the least significant address bits C1 and C2 are set to $\overline{RN1}$ and $\overline{RN2}$ during the normal mode of operation. In a burst mode, a burst address controlled by the address control clock K1 is generated. Thus, during burst mode, C1 and C2 are set to $\overline{RC1}$ and $\overline{RC2}$. Here, the clocks K1 and K2 are active during alternating time intervals.

Therefore, in the conventional redundancy decoding scheme, the address control clock cannot be used in the interior of the redundancy decoder and so the burst address control circuit is additionally installed. Further, the burst address is generated by the burst address control circuit before being applied to the redundancy decoder. Therefore, the speed at which the redundancy word line can be enabled may be reduced.

SUMMARY OF THE INVENTION

It is therefore an object of the present invention to provide improved integrated circuit memory devices.

It is another object of the present invention to provide integrated circuit memory devices having improved burst mode operation.

These and other objects, advantages and features of the present invention are provided by integrated circuit memory devices which contain an array of memory cells arranged as a plurality of normal rows of memory cells electrically coupled to respective normal section word lines (SWL) and a plurality of redundant rows of memory cells electrically coupled to respective redundant section word lines (RSWL). A first normal section row decoder is also provided. The first normal section row decoder has first inputs electrically coupled to a plurality of burst address selection lines (Ci, Cj, Ck and Cl), a second input electrically coupled to a normal main word line (MWL) and outputs electrically coupled to a plurality of the normal section word lines (SWL1–4). A first redundancy section row decoder is also preferably provided. The first redundancy section row decoder has first inputs electrically coupled to the plurality of burst address selection lines, a second input electrically coupled to a redundant main word line (RMWL) and outputs electrically coupled to a plurality of the redundant section word lines (RSWL1–4). Normal main row decoder means is also provided and is responsive to a most significant portion of a row address. When the appropriate portion of a predetermined row address is provided, the main row decoder means drives the corresponding normal main word line. Moreover, redundant main row decoder means is provided and is responsive to the most significant portion of the row address. Similarly, when the appropriate portion of a predetermined row address is provided, the redundant main row decoder means drives the corresponding redundant main word line. In addition, burst address selection means is preferably provided. The burst address selection means is responsive to a least significant portion of the row address and performs the function of driving the burst address selection lines. The burst address selection means preferably comprises circuits therein which are responsive to normal and out-of-phase clock signals for burst mode operation.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
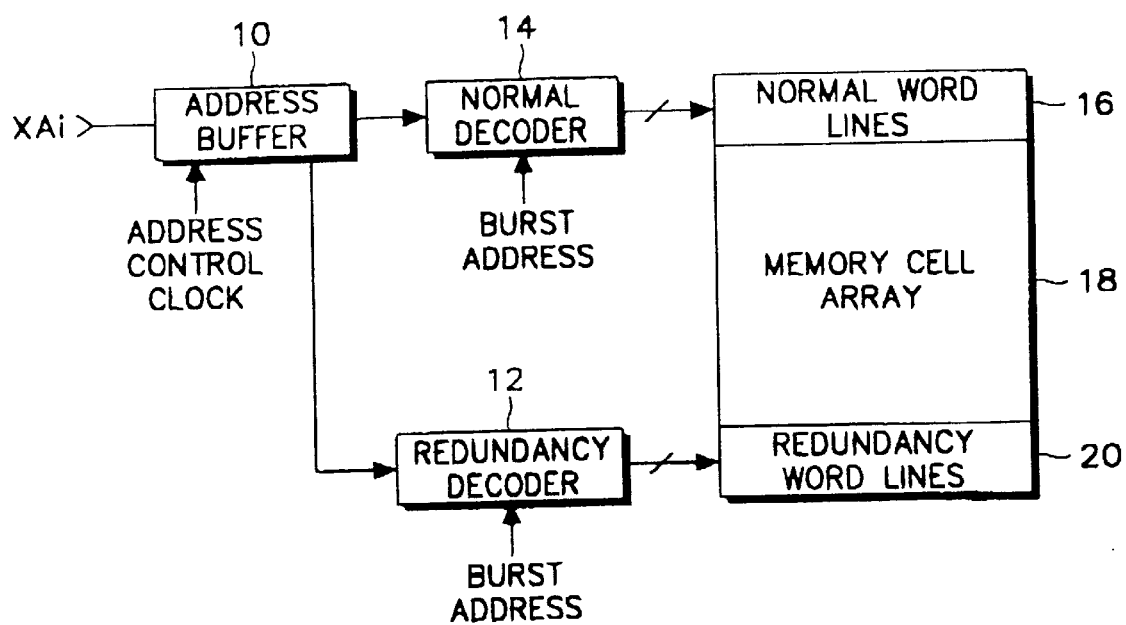
FIG. 1 is a block electrical diagram of conventional memory device having redundancy word lines for correcting defective word lines.
Figure 2:
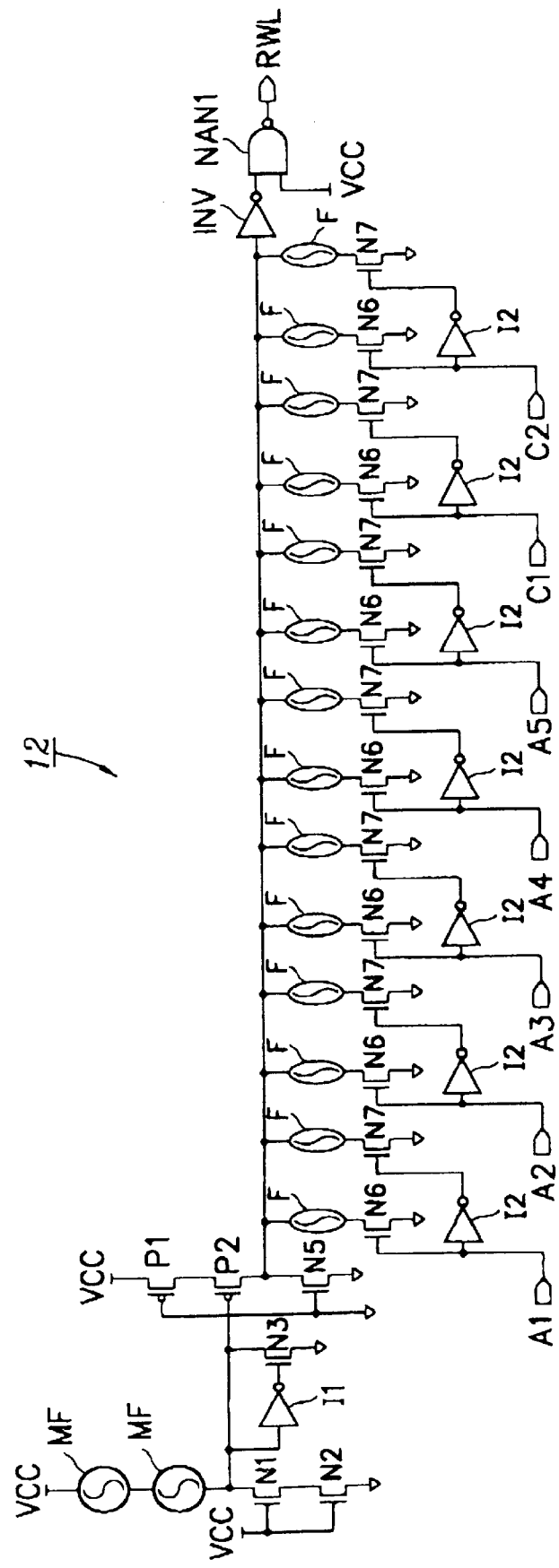
FIG. 2 is an electrical schematic of the redundancy decoder of FIG. 1.
Figure 3:
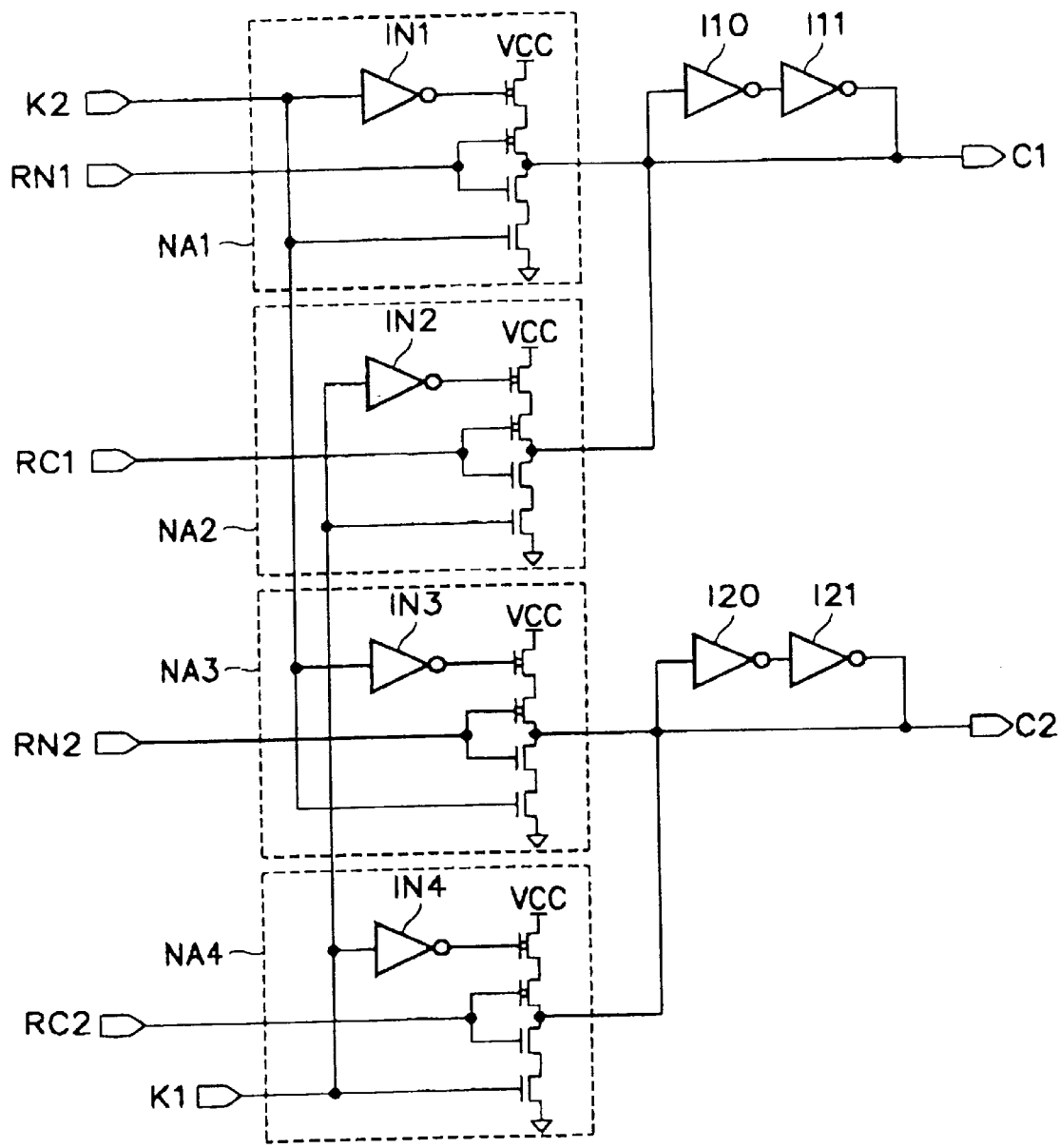
FIG. 3 is an electrical schematic of a burst address control circuit which provides burst addresses to the redundancy decoder of FIG. 2.
Figure 4:
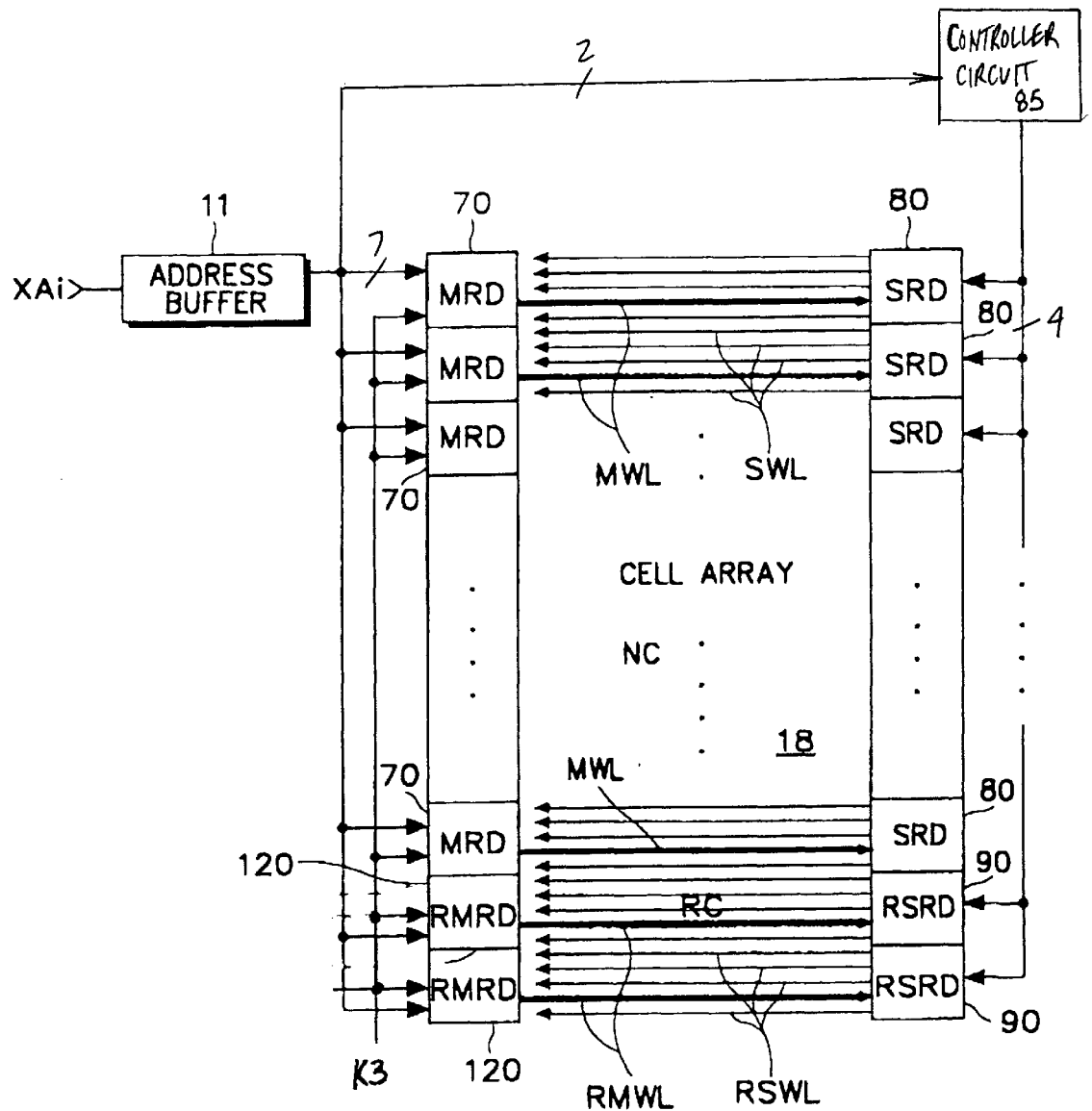
FIG. 4 is a block electrical diagram of a memory device according to a first embodiment of the present invention.

Referring to FIG. 4, there is provided an address buffer 11 which receives address signals Xai (e.g., 9-bit wide address for 1 Mbit SRAM), a plurality of redundancy main row decoders (RMRD) 120, a plurality of main row decoders (MRD) 70, a plurality of section row decoders (SRD) 80 and a plurality of redundancy section row decoders (RSRD) 90. As illustrated, these decoders are electrically coupled to an array 18 of memory cells having normal cells (NC) and redundant cells (RC). To reduce timing delay when a redundancy cell (RC) is selected, the decoder circuitry for enabling a word line is divided into the main row decoders 70, the section row decoders 80, the redundancy main row decoders 120 and the redundancy section row decoders 90. An address control clock K3 is directly applied to the redundancy main row decoders 120 and main row decoders 70. As illustrated, the redundancy section row decoders 90 are electrically coupled to respective redundancy main word lines RMWL (which are coupled to outputs of the redundancy main row decoders 120). The redundancy section row decoders 90 drive respective redundancy section word lines RSWL1–4 to levels corresponding to the level of the corresponding redundancy main word line RMWL which may be a metal line. Similarly, section row decoders 80 drive section word lines SWL1–SWL4 to levels corresponding to the level of the corresponding main word line MWL which may be a metal line.

Figure 5:
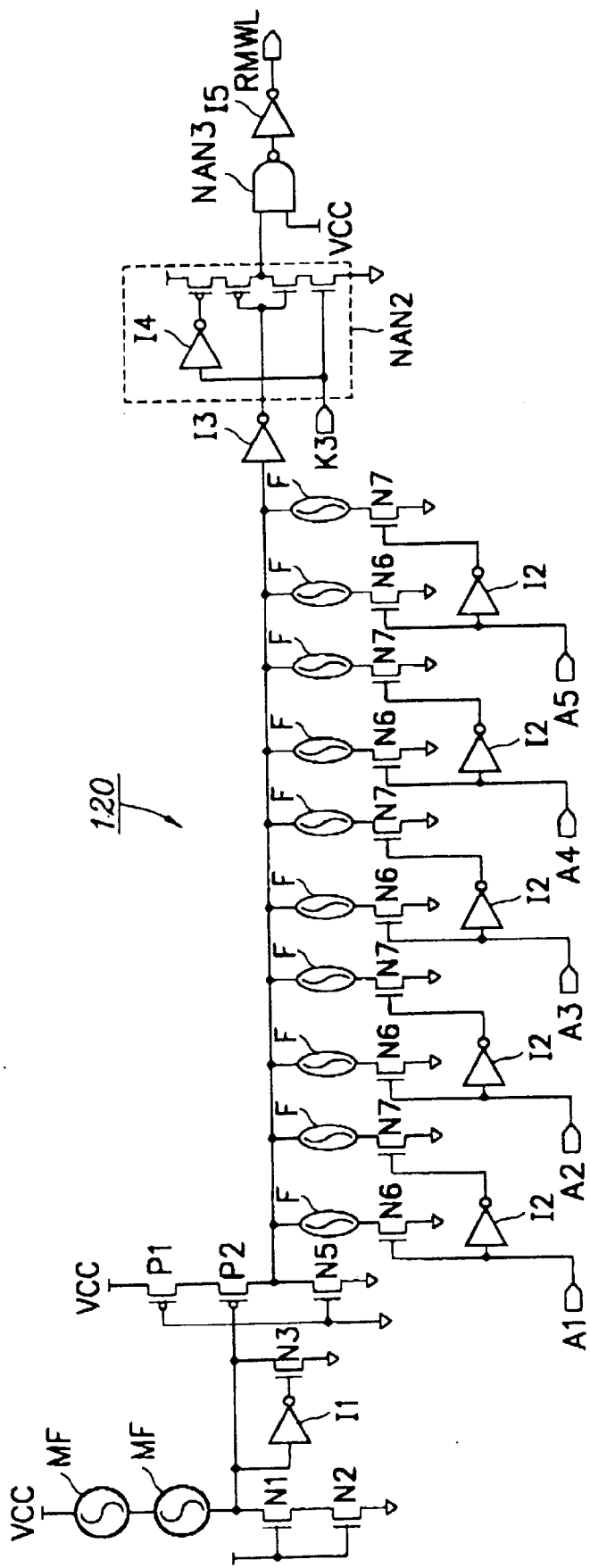
FIG. 5 is an electrical schematic of the redundancy main row decoder of FIG. 4.

Each redundancy main row decoder 120 is constructed as shown in FIG. 5. The redundancy decoder 120 includes a pass gate NAN2 for receiving the address control clock K3. The redundancy main row decoder 120 also includes master fuses MF, a plurality of internal fuses F, driving transistors N1–N3, N5, P1 and P2, decoding transistors N6 and N7, an output inverter I3 and a decoding output NAND gate NAN3. Based on the illustrated embodiment, when the redundancy main word line RMWL is provided as a repair word line, four (4) redundancy section word lines are also provided as repair word lines for burst mode operation. Before a decoded burst address is applied to the section row decoders 80 and the redundancy section row decoders 90, a process for separating external addresses into an address signal for normal operation and an address signal for burst operation is implemented through the address buffer 11.

Figure 6:
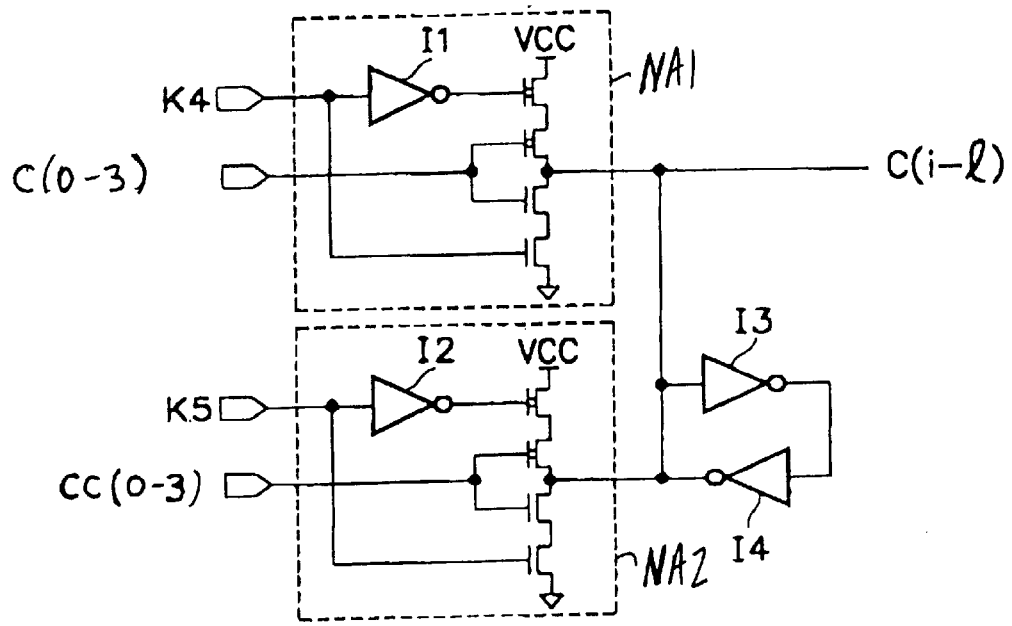
FIG. 6 is an electrical schematic of a portion of a preferred burst/normal mode controller circuit.

FIG. 6 shows a portion of a burst/normal mode controller circuit 85 which can implement the normal operation and the burst mode operation by generating word line control signals Ci, CJ, Ck and Cl on burst address selection lines. The circuit of FIG. 6 is one of four circuits for the case where two least significant bits of a row address are used to ultimately define an appropriate section word line (SWL or RSWL) which may comprise polycrystalline silicon. The circuits of FIG. 6 receive pairs of signals (i.e., (C0, CC0), (C1, CC1), (C2, CC2) and (C3, CC3) provided by a burst address generator circuit which receives the least significant bits (e.g., 2 bits) of a row address. The controller circuit 85 preferably comprises the burst address generator circuit. The circuits of FIG. 6 each include inverters I1 and I2 for inverting clock signal K4 or K5, decoding pass gates NA1 and NA2 and inverters I3 and I4 for performing a latch operation. Here, the signals C0–C3 represent the outputs of a 2-to-4 burst address decoder (not shown) which takes two least significant bits of a row address C0 and C1 (where C0 and C1 may equal (00), (01), (10) and (11)) and decodes them to drive one of the four outputs (C0, C1, C2 and C3). The signals CC0–CC3 represent the outputs of a counter circuit (not shown) which is also responsive to the two least significant bits of the row address. Here, the signals CC0, CC1, CC2 and CC3 go high on the count of one, two, three and four. The burst address generator circuit preferably comprises the counter circuit and burst address decoder. Signal K4 is a clock signal which is a version of normal clock signal K3 and K5 is a clock signal which is enabled during burst operation. The outputs Ci, Cj, Ck and Cl of the four circuits are applied as inputs to the redundancy section row decoders 90 of FIG. 7 (and the section row decoders 80 which have the same construction).

Figure 7:
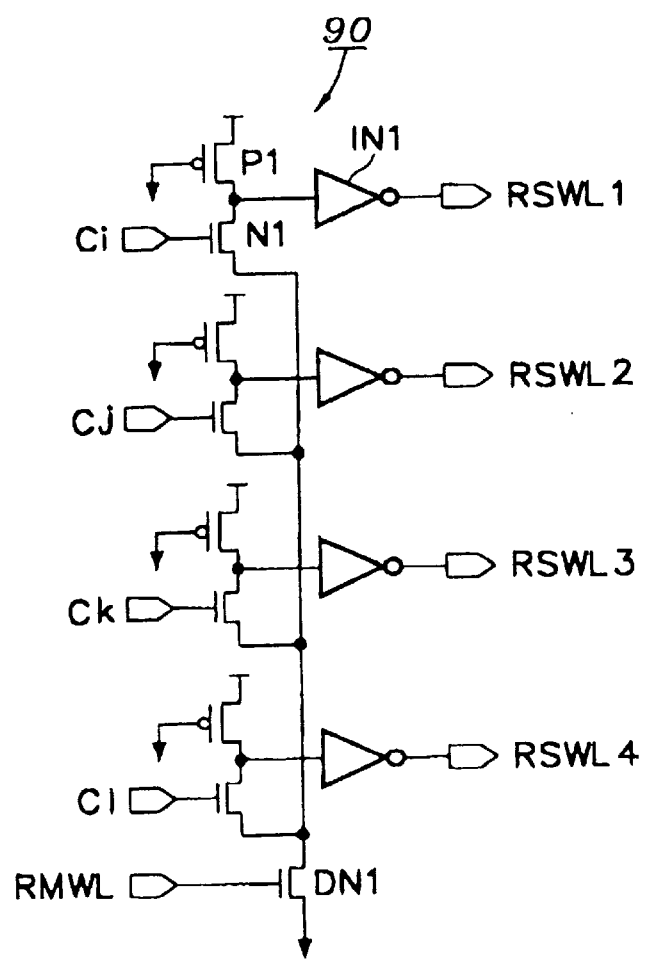
FIG. 7 is an electrical schematic of the redundancy section row decoders of FIG. 4.
Figure 1:
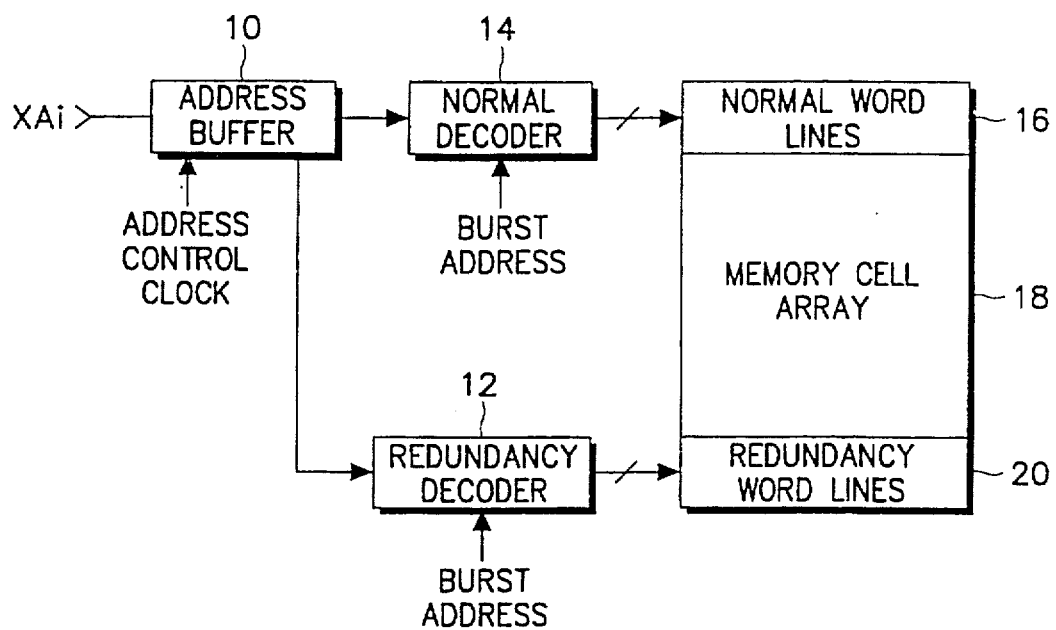
Figure 2:
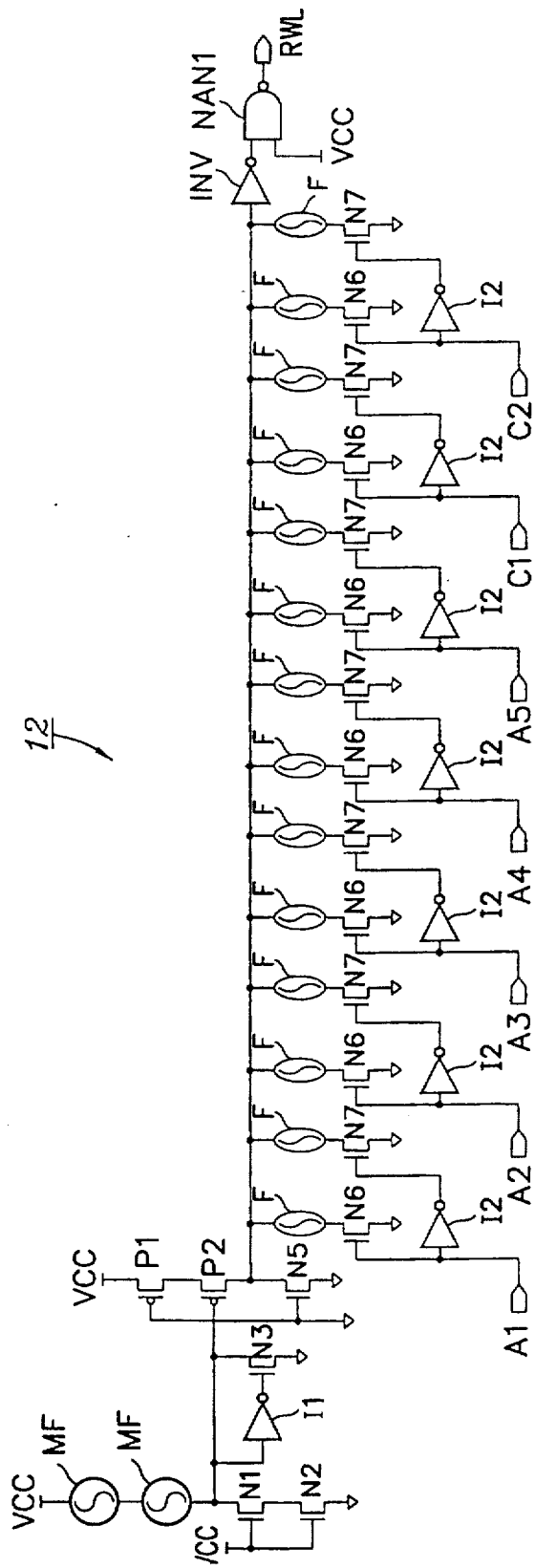
Figure 3:
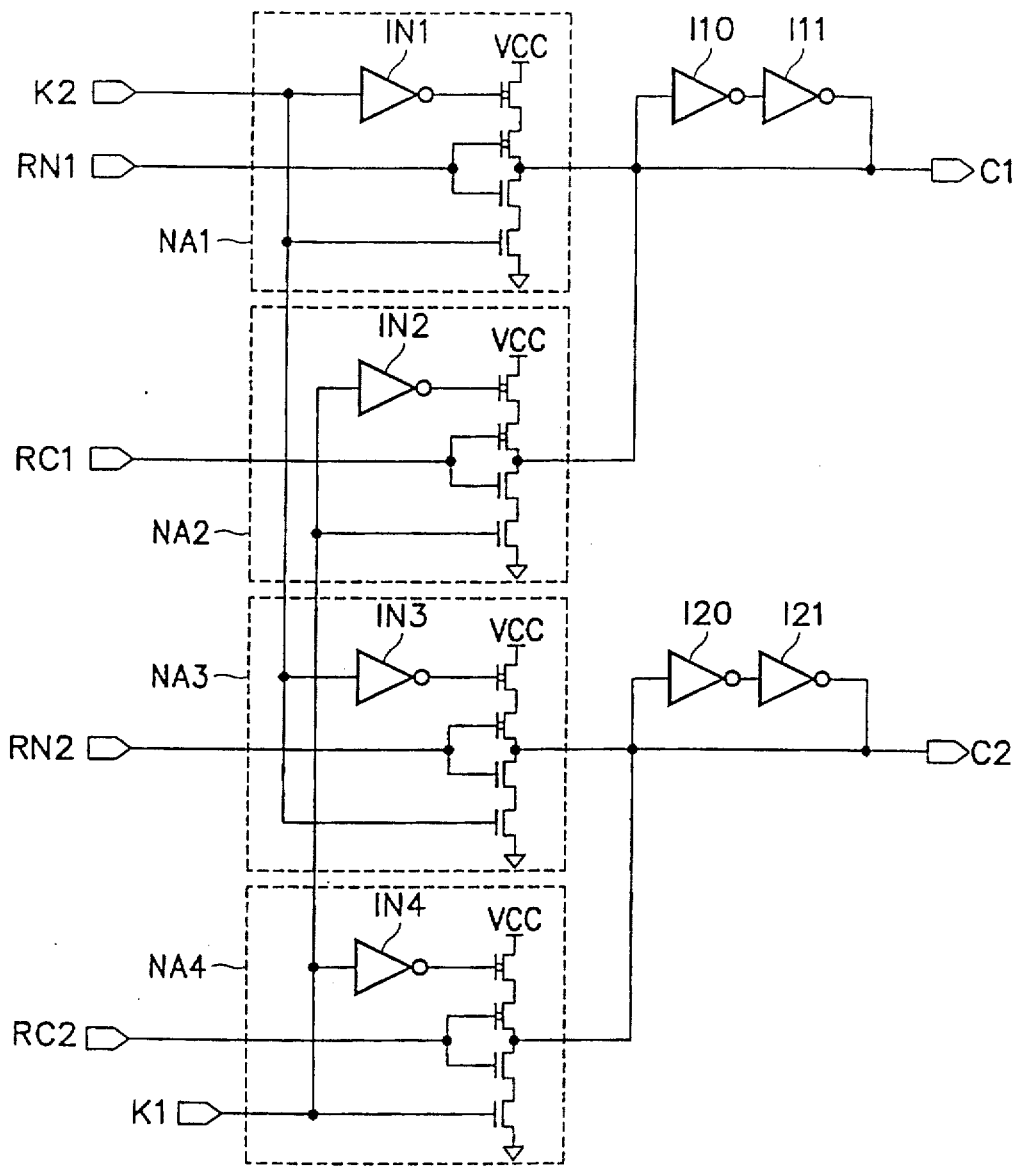
Figure 4:
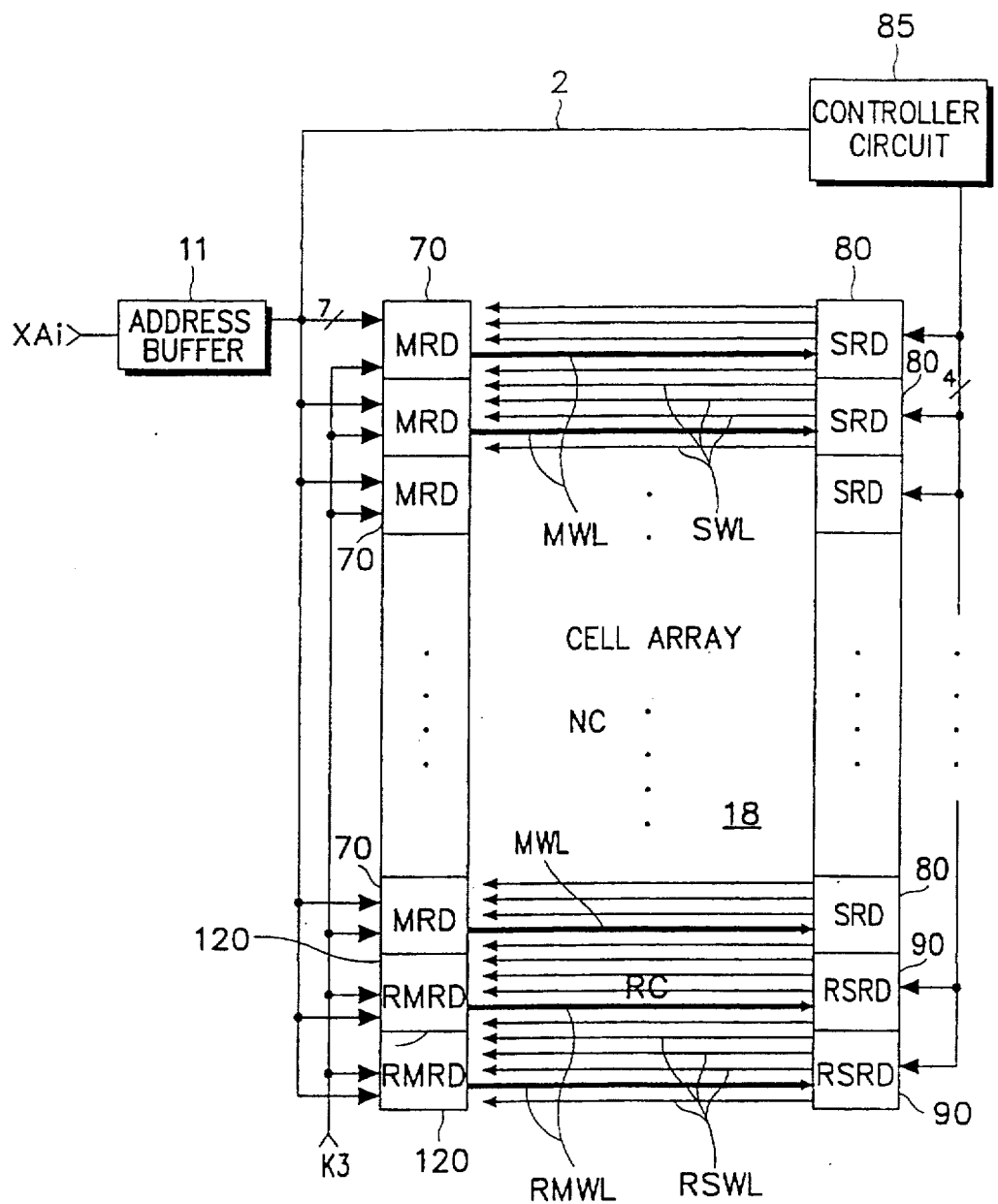
Figure 5:
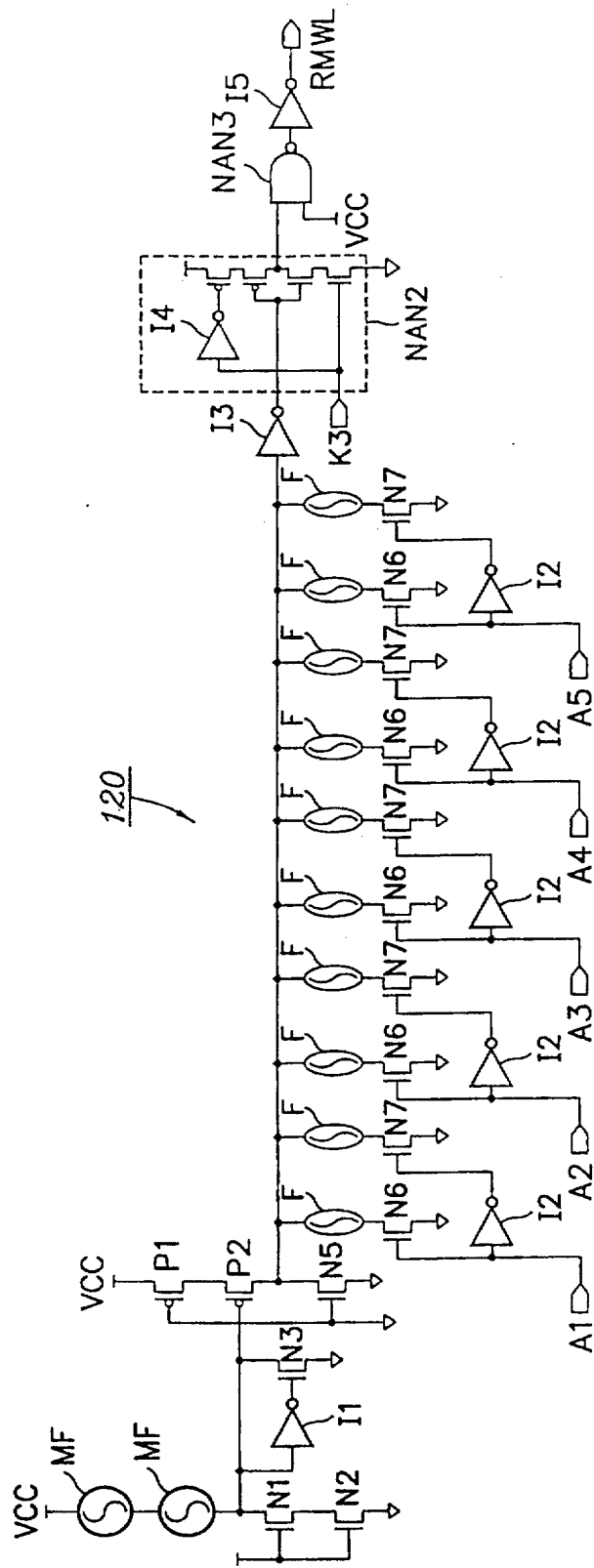
Figure 6:
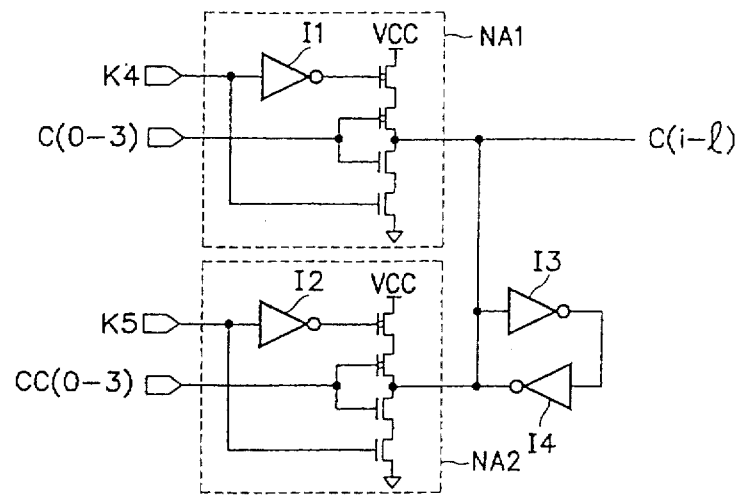
Figure 7:
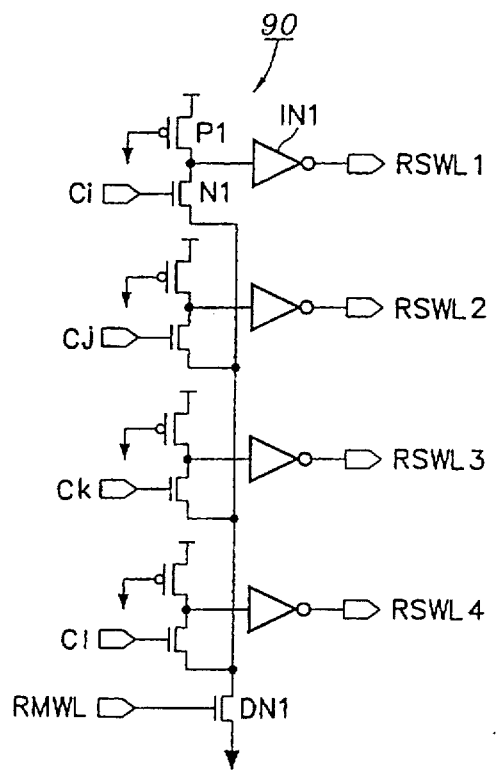

FIG. 7 is a detailed circuit diagram of the redundancy section row decoders 90. The redundancy section row decoders 90 have the same internal construction as the normal section row decoders 80. Since the burst address is directly applied to the redundancy section row decoders 90, the address control clock K3 can be applied directly to the redundancy main row decoders 120 of FIG. 5. Consequently, during burst mode, the output RMWL of a redundancy main row decoder 120 is mixed with the word line control/selection signals Ci–Cl through the redundancy section row decoder 90, to enable the corresponding redundancy section word lines RSWL (e.g., one-at-a-time). Thus, since the address control clock K3 can be applied directly to the redundancy main row decoder 120 of FIG. 5, it is possible to directly control the redundancy main row decoder 120.

Moreover, although it might appear that there could be a speed delay while passing through the fuses shown in FIG. 5, since the output RMWL of the redundancy main row decoder 120 is directly controlled by the address control clock K3, the section word line enable speed actually becomes faster. Such a decoder is therefore more preferable for high speed synchronous memory devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   an array of memory cells arranged as a plurality of normal rows of memory cells electrically coupled to respective normal section word lines and a plurality of redundant rows of memory cells electrically coupled to respective redundant section word lines;
   a first normal section row decoder having first inputs electrically coupled to a plurality of burst address selection lines, a second input electrically coupled to a normal main word line and outputs electrically coupled to a plurality of the normal section word lines;
   a first redundancy section row decoder having first inputs electrically coupled to the plurality of burst address selection lines, a second input electrically coupled to a redundant main word line and outputs electrically coupled to a plurality of the redundant section word lines;
   normal main row decoder means, responsive to a most significant portion of a row address, for driving the normal main word line;
   redundant main row decoder means, responsive to the most significant portion of the row address, for driving the redundant main word line; and
   burst address selection means, responsive to a least significant portion of the row address, for driving the burst address selection lines.

2. The memory device of claim 1, wherein said burst address selection means comprises a burst mode controller circuit having a burst address generator therein which receives the least significant portion of the row address.

3. The memory device of claim 2, wherein the burst mode controller circuit has a section word line control signal generator therein coupled to an output of the burst address generator.

4. The memory device of claim 3, wherein the section word line control signal generator has outputs coupled to the burst address selection lines.

5. The memory device of claim 4, wherein said normal main row decoder means and said redundant main row decoder means are responsive to a address control clock.

6. The memory device of claim 1, wherein said normal main row decoder means and said redundant main row decoder means are responsive to a address control clock.

* * * * *

UNITED STATES PATENT AND TRADEMARK OFFICE
CERTIFICATE OF CORRECTION

PATENT NO. : 5,859,802
DATED : January 12, 1999
INVENTOR(S) : Jin-Ho Lee, et al.

It is certified that error appears in the above-indentified patent and that said Letters Patent is hereby corrected as shown below:

The title page, should be deleted to appear as per attached sheet.
The sheets of drawings consisting of figures 1-7 should be deleted to appear as per attached Figures 1-7.

Signed and Sealed this

Twenty-third Day of November, 1999

Attest:

Q. TODD DICKINSON

*Attesting Officer*   *Acting Commissioner of Patents and Trademarks*

United States Patent [19]
Lee et al.

[11] Patent Number: 5,859,802
[45] Date of Patent: Jan. 12, 1999

[54] INTEGRATED CIRCUIT MEMORY DEVICES HAVING MAIN AND SECTION ROW DECODERS FOR PROVIDING IMPROVED BURST MODE OPERATION

[75] Inventors: Jin-Ho Lee; Hee-Chul Pack, both of Seoul, Rep. of Korea

[73] Assignee: Samsung Electronics Co., Ltd., Suwon, Rep. of Korea

[21] Appl. No.: 986,742

[22] Filed: Dec. 8, 1997

[30]   Foreign Application Priority Data

Dec. 6, 1996 [KR] Rep. of Korea ............... 96-62415

[51] Int. Cl.⁶ ........................................... G11C 7/00
[52] U.S. Cl. ............... 365/200; 365/230.06; 365/238.5
[58] Field of Search ...................... 365/200, 230.06, 365/238.5, 233

[56]   References Cited

U.S. PATENT DOCUMENTS

| | | | |
|---|---|---|---|
| 5,299,164 | 3/1994 | Takeuchi et al. | 365/200 |
| 5,428,573 | 6/1995 | Watanabe | 365/200 |
| 5,502,676 | 3/1996 | Pelley, III et al. | 365/200 |
| 5,621,690 | 4/1997 | Jungroth et al. | 365/200 |
| 5,737,269 | 4/1998 | Fujita | 365/200 |

*Primary Examiner*—Son T. Dinh
*Attorney, Agent, or Firm*—Myers Bigel Sibley & Sajovec

[57]   ABSTRACT

Integrated circuit memory devices having improved burst mode operation include an array of memory cells arranged as a plurality of normal rows of memory cells electrically coupled to respective normal section word lines (SWL) and a plurality of redundant rows of memory cells electrically coupled to respective redundant section word lines (RSWL). A first normal section row decoder is also provided. The first normal section row decoder has first inputs electrically coupled to a plurality of burst address selection lines (Ci, Cj, Ck and Cl), a second input electrically coupled to a normal main word line (MWL) and outputs electrically coupled to a plurality of the normal section word lines (SWL1-4). A first redundancy section row decoder is also preferably provided. The first redundancy section row decoder has first inputs electrically coupled to the plurality of burst address selection lines, a second input electrically coupled to a redundant main word line (RMWL) and outputs electrically coupled to a plurality of the redundant section word lines (RSWL1-4). Normal main row decoder circuitry is also provided and is responsive to a most significant portion of a row address. When the appropriate portion of a predetermined row address is provided, the main row decoder circuitry drives the corresponding normal main word line. Moreover, redundant main row decoder circuitry is provided and is responsive to the most significant portion of the row address. When the appropriate portion of a predetermined row address is provided, the redundant main row decoder circuitry drives the corresponding redundant main word line.

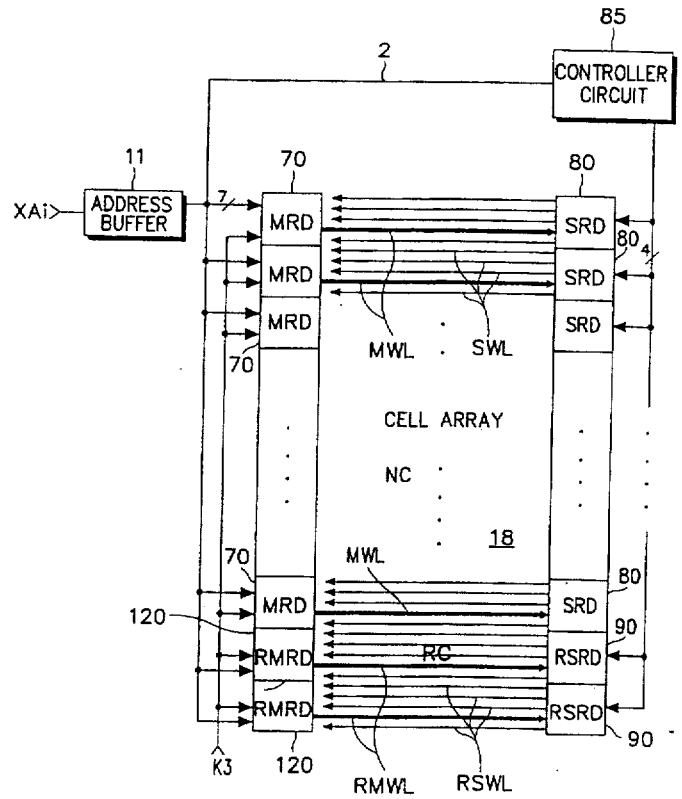

6 Claims, 6 Drawing Sheets